United States Patent
Yamada et al.

(10) Patent No.: US 12,020,916 B2
(45) Date of Patent: Jun. 25, 2024

(54) NIOBIUM SPUTTERING TARGET

(71) Applicant: JX Nippon Mining & Metals Corporation, Tokyo (JP)

(72) Inventors: Yuki Yamada, Ibaraki (JP); Kotaro Nagatsu, Ibaraki (JP)

(73) Assignee: JX Metals Corpo tion, Tokyo (JP)

( * ) Notice: Subject to any disclaimer, the term of this patent is extended or adjusted under 35 U.S.C. 154(b) by 133 days.

(21) Appl. No.: 17/439,123

(22) PCT Filed: Jan. 28, 2020

(86) PCT No.: PCT/JP2020/003024
§ 371 (c)(1),
(2) Date: Sep. 14, 2021

(87) PCT Pub. No.: WO2020/195121
PCT Pub. Date: Oct. 1, 2020

(65) Prior Publication Data
US 2022/0157583 A1    May 19, 2022

(30) Foreign Application Priority Data

Mar. 26, 2019    (JP) ................................ 2019-058996

(51) Int. Cl.
C23C 14/34    (2006.01)
H01J 37/34    (2006.01)

(52) U.S. Cl.
CPC ...... H01J 37/3426 (2013.01); C23C 14/3407 (2013.01); H01J 37/3476 (2013.01)

(58) Field of Classification Search
CPC ............... H01J 37/3411; H01J 37/3414; H01J 37/3426; H01J 37/3476; H01J 37/3429;
(Continued)

(56) References Cited

U.S. PATENT DOCUMENTS

2002/0072475 A1    6/2002    Michaluk et al.
2002/0112789 A1    8/2002    Jepson et al.
(Continued)

FOREIGN PATENT DOCUMENTS

CN    1535322 A    10/2004
CN    101660130 A    3/2010
(Continued)

OTHER PUBLICATIONS

European communication dated Nov. 11, 2022 in corresponding European patent application No. 20779665.7.
(Continued)

*Primary Examiner* — Rodney G McDonald
(74) *Attorney, Agent, or Firm* — NIELDS, LEMACK & FRAME, LLC

(57) ABSTRACT

Provided is a niobium sputtering target having improved film thickness uniformity throughout the target life.

In the niobium sputtering target, a rate of change in a {111} area ratio of each of an upper, central, and lower portions of the sputtering target, as represented by the following equation (2), is 2.5 or less, and the {111} area ratio of each of the upper, central and lower portions is determined by dividing a cross section of a plate-shaped sputtering target perpendicular to a sputtering surface into three equal portions: the upper portion, the central portion and the lower portion from a sputtering surface side in a normal direction of the sputtering surface at an intermediate position between a center and an outer circumference of the sputtering surface of the plate-shaped sputtering target, and measuring a crystal orientation distribution of each of measured regions of the upper portion, the central portion, and the lower portion using an EBSD method:

the {111} area ratio=total area of crystal grains having a {111} plane oriented in the normal direction in the measured regions/total area of the measured regions    Equation (1);

the rate of change=[maximum value−minimum value]/minimum value    Equation (2).

7 Claims, 4 Drawing Sheets

(58) Field of Classification Search
CPC ............ C23C 14/3407; C23C 14/3414; C23C 14/083; C23C 14/14; C22C 27/02
USPC ...................................... 204/298.12, 298.13
See application file for complete search history.

(56) References Cited

U.S. PATENT DOCUMENTS

| | | |
|---|---|---|
| 2005/0263217 A1 | 12/2005 | Michaluk et al. |
| 2015/0292081 A1 | 10/2015 | Hogan et al. |
| 2018/0080120 A1 | 3/2018 | Ivanov et al. |

FOREIGN PATENT DOCUMENTS

| | | |
|---|---|---|
| JP | 2004-511651 A | 4/2004 |
| JP | 2014-194072 A | 10/2014 |
| JP | 2018-519413 A | 7/2018 |
| TW | 201602380 A | 1/2016 |
| WO | 2004/064114 A2 | 7/2004 |

OTHER PUBLICATIONS

International Search Report and Written Opinion dated Mar. 31, 2020 in corresponding PCT application No. PCT/JP2020/003024.
International Preliminary Report on Patentability dated Oct. 7, 2021 in corresponding PCT application No. PCT/JP2020/003024.

NIOBIUM SPUTTERING TARGET

FIELD OF THE INVENTION

The present invention relates to a niobium sputtering target.

BACKGROUND OF THE INVENTION

Sputtering methods for forming coatings of metals, ceramics, and the like are used in many fields such as electronics, corrosion-resistant materials and decorations, catalysts, cutting/polishing materials, and wear-resistant materials. The sputtering methods themselves are well known in the above fields, and they are also used when forming an anti-reflection film on a surface of a display device. For the anti-reflection film, a $Nb_2O_5$ film may be used. Recently, Nb is attracting attention as an interconnect application for quantum computers, and it is expected that niobium sputtering targets will be used. In order to meet such most advanced applications, there is a need for a niobium sputtering target having improved film thickness uniformity and no problem of reactive sputtering stability. Patent Literature 1 is known for the niobium sputtering target.

CITATION LIST

Patent Literatures

[Patent Literature 1] Japanese Patent Application Publication No. 2014-194072 A

SUMMARY OF THE INVENTION

Technical Problem

In an embodiment of the present invention, an object of the present invention is to provide a niobium sputtering target having improved film thickness uniformity throughout the target life (uniform film thickness for a plurality of films formed by carrying out sputtering methods using the same niobium sputtering target).

Solution to Problem

[1]
A niobium sputtering target, wherein a rate of change in a {111} area ratio of each of an upper, central, and lower portions of the sputtering target, as represented by the following equation (2), is 2.5 or less, wherein the {111} area ratio of each of the upper, central and lower portions is determined by dividing a cross section of a plate-shaped sputtering target perpendicular to a sputtering surface into three equal portions: the upper portion, the central portion and the lower portion from a sputtering surface side in a normal direction of the sputtering surface at an intermediate position between a center and an outer circumference of the sputtering surface of the plate-shaped sputtering target, and measuring a crystal orientation distribution of each of measured regions of the upper portion, the central portion, and the lower portion using an EBSD method:

the {111} area ratio=total area of crystal grains having a {111} plane oriented in the normal direction in the measured regions/total area of the measured regions  Equation (1)

the rate of change=[maximum value−minimum value]/minimum value  Equation (2).

[2]
The niobium sputtering target according to [1], wherein the {111} area ratio of the central portion is 40% or less.

[3]
The niobium sputtering target according to [1], wherein the {111} area ratio of the central portion is 60% or more.

[4]
The niobium sputtering target according to any one of [1] to [3], wherein a {100} area ratio of each of the upper portion, the central portion, and the lower portion is 30% or more, wherein the {100} area ratio is determined by measuring a crystal orientation distribution of each of the upper portion, the central portion and the lower portion using a EBSD method, and obtaining the {100} area ratio of each of measured regions of the upper portion, the central portion, and the lower portion according to the following Equation (3):

the {100} area ratio=total area of crystal grains having a {100} plane oriented in the normal direction in the measured regions/total area of the measured regions  Equation (3).

[5]
The niobium sputtering target according to any one of [1] to [4], wherein each of the upper portion, the central portion, and the lower portion has an average crystal grain size of from 30 to 100 μm.

[6]
The niobium sputtering target according to any one of [1] to [5], wherein a rate of change represented by the following Equation (4) is 1.0 or less for the average crystal grain size of each of the upper portion, the central portion, and the lower portion:

the rate of change=[maximum value−minimum value]/minimum value  Equation (4).

Advantageous Effects of Invention

According to an embodiment of the present invention, it is possible to provide a niobium sputtering target having improved film thickness uniformity throughout the target life.

DETAILED DESCRIPTION OF THE INVENTION

Figure 1:
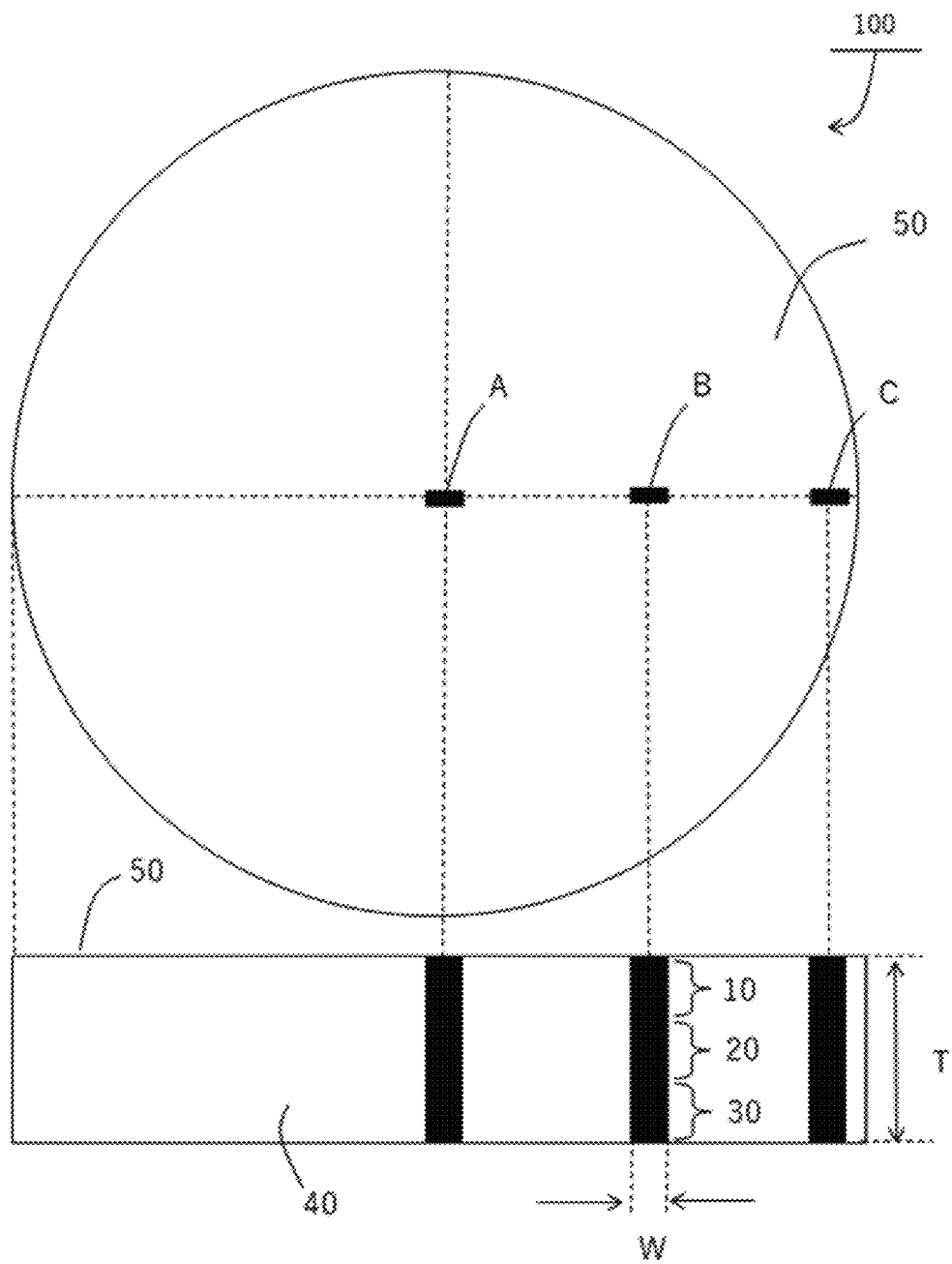
FIG. 1 is a schematic view showing a cross-sectional region for performing EBSD measurement for a niobium sputtering target according to an embodiment of the present invention.

Hereinafter, the present invention is not limited to each of embodiments, and components may be modified and embodied without departing from the spirit of the present invention. Further, various inventions can be formed by appropriately combining a plurality of components disclosed in each embodiment. For example, some components may be removed from all the components shown in the embodiments. Further, the components of different embodiments may be optionally combined.

(1) Niobium Sputtering Target (Composition)

In an embodiment, a niobium sputtering target according to the present invention is formed from niobium metal except for unavoidable impurities. In an embodiment, the niobium sputtering target according to the present invention has a purity of 99.95% by mass or more. The impurities in the target causes deterioration of reflective properties of a reflective film in a display device, and reduction of reliability of interconnect of a quantum computer. Therefore, it is preferable to use the niobium metal having a purity as high as possible. As used herein, the purity of 99.95% by mass or more means that the total value of Na, Al, Si, K, Ti, Cr, Mn, Fe, Co, Ni, Cu, Zn, Zr, Ta, Mo, and W is 500 ppm by mass or less, as analyzed by glow discharge mass spectrometry (GDMS).

(Shape of Target)

The shape of the niobium sputtering target according to the present invention is not particularly limited as long as it is a plate shape. Examples include a flat plate shape such as a disk shape or a rectangular flat plate shape. The niobium sputtering target can have a certain thickness, including, but not limited to, for example, from 2 to 18 mm, and typically from 3 to 10 mm.

(Rate of Change in {111} Area Ratio)

Niobium has a property in which a {111} plane is oriented when strain is applied. When a plate-shaped niobium sputtering target is produced through a rolling step, the niobium sputtering target generally generates a region where the {111} plane of crystal grains is oriented in a normal direction of a sputtering surface (hereinafter referred to as a "band"), at the central portion in the thickness direction.

Although not bounded by any theory, it is believed that this may be due to the following reasons. In the rolling step, a pressure is applied from above and below in the thickness direction, so that the center of the thickness direction is strongly compressed from the up and down directions. The upper and lower portions in the thickness direction are prevented from deforming by friction with rolling rolls, while the central portion in the thickness direction is not in contact with the rolling rolls and is not affected by the friction with the rolling rolls, so that the strain is concentrated at the central portion in the thickness direction. As a result, the niobium sputtering target generates the band at the central portion in the thickness direction.

However, the generation of the band at the central portion in the thickness direction means that the crystal orientation changes at the central portion in the thickness direction of the sputtering target. In this case, even if sputtering is performed under the same conditions, the sputtering characteristics will be different at the central portions in the thickness direction of the sputtering targets, leading to a change of the thickness of the sputtered film. As a result, the thickness uniformity of the sputtered film cannot be maintained throughout the target life.

Therefore, in order to improve the film thickness uniformity throughout the target life, it is desirable to extend the region where the {111} plane of the crystal grains is oriented in the normal direction of the sputtering surface to the entire thickness direction of the target or to prevent the {111} plane of the crystal grains from being oriented in the normal direction of the sputtering surface at the central portion in the thickness direction. More specifically, the sputtering target is divided into three equal portions: an upper portion, a central portion and a lower portion from the above sputtering surface side in the normal direction of the sputtering surface, and an area ratio of the crystal grains in which the {111} plane is oriented in the normal direction of the sputtering surface, for each of the above portions, is determined using the EBSD method, and in this case, it is preferable that a rate of change calculated from the area ratios is lower, based on the Equation: rate of change= [maximum value−minimum value]/minimum value.

Further, the band tends to be developed especially at an intermediate position between a center and an outer circumference of the sputtering surface. In other words, at the intermediate position between the center and the outer circumference of the sputtering surface, a difference between the maximum and minimum values of the above area ratio for the upper portion, the central portion, and the lower portion is increased. In order to improve the thickness uniformity of the sputtered film throughout the target life, it is advantageous to control the rate of change at the intermediate position where the difference between the maximum and minimum values of the above area ratio tends to be increased.

Therefore, in an embodiment of the niobium sputtering target according to the present invention, when a cross section of a plate-shaped target perpendicular to the sputtering surface is divided into three equal portions: the upper portion, the central portion and the lower portion from the sputtering surface side in the normal direction of the sputtering surface at the intermediate position between the center and the outer circumference of the sputtering surface of the plate-shaped target, and a crystal orientation distribution of each of the upper, central, and lower portions of the target is measured using the EBSD method, and the {111} area ratio is determined according to the following Equation (1) for each of the measured regions of the upper, central, and lower portions, the rate of change in the {111} area ratio of each of the upper, central, and lower portions, represented by the following Equation (2), is 2.5 or less:

the {111} area ratio=total area of the crystal grains having a {111} plane oriented in the normal direction in the measured regions/total area of the measured regions    Equation (1)

the rate of change=[maximum value−minimum value]/minimum value    Equation (2).

Thus, the {111} area ratios of the upper, central, and lower portions of the target do not significantly change, i.e., the generation of the band is controlled, whereby the film thickness uniformity can be improved through the target life. The rate of change represented by the above Equation (2) is preferably 2.3 or less, and more preferably 2.1 or less. There is no particular lower limit for the rate of change represented by the Equation (2) as described above, and it is most preferably zero, but it is typically 0.1 or more, and more typically 1.0 or more.

({111} Area Ratio)

In an embodiment of the niobium sputtering target according to the present invention, the {111} area ratio of the central portion is 40% or less. When the {111} surface is oriented in the normal direction of the sputtering surface, a film deposition rate tends to be faster because the densest direction coincides with the normal direction of the sputtering surface. Therefore, by decreasing the {111} area ratio of the central portion, the deposition rate can be decrease to control the film thickness easily. In a niobium sputtering target with a decreased rate of change represented by the Equation (2) as described above, the decreased {111} area ratio of the central portion also leads to decreased {111} area ratios of the upper and lower portions, so that the deposition rate can be decreased for the sputtering target as a whole. From the viewpoint of the film thickness controllability, the {111} area ratio of the central portion is preferably 40% or less, and more preferably 35% or less, and even more preferably 33% or less. There is no particular lower limit of the {111} area ratio of the central portion, but the lower limit may typically be 5% or more, and more typically 10% or more.

In an embodiment of the niobium sputtering target according to the present invention, the {111} area ratio of the central portion is 60% or more. Because of the reasons as described above, the {111} area ratio of the central portion can be increased to increase the deposition rate and shorten the sputtering time, thereby improving the production efficiency. For the niobium sputtering target with the decreased rate of change represented by the Equation (2) as described above, the increased {111} area ratio of the central portion also leads to the increased {111} area ratios of the upper and lower portions, so that the deposition rate can be increased for the sputtering target as a whole.

From the viewpoint of increasing the production efficiency of the film deposition, the {111} area ratio of the central portion is preferably 60% or more, and more preferably 63% or more, and even more preferably 66% or more. There is no particular upper limit for the above {111} area ratio, but it may typically be 80% or less.

({100} Area Ratio)

In an embodiment of the niobium sputtering target according to the present invention, when the crystal orientation distributions of the upper, central, and lower portions are measured using the EBSD method, and the {100} area ratio is determined for each of the measured regions of the upper, central, and lower portions according to the following Equation (3), each {100} area ratio is 30% or more:

the {100} area ratio=total area of crystal grains having a {100} plane oriented in the normal direction in the measured regions/total area of the measured regions    Formula (3).

For niobium, which has a body-centered cubic structure, the densest direction of the atom is <111>. When the {100} plane is oriented in the normal direction of the sputtering surface, an angle of the densest direction with respect to the normal direction of the sputtering surface is increased (wider), so that niobium atoms are radially ejected from the sputtering target during sputtering. This can lead to a decreased number of sites where a partially thicker film is generated in the film deposited by sputtering, thereby providing good in-plane uniformity of film thickness.

From the viewpoint of improving the in-plane uniformity of the film thickness, the above {100} area ratio of each of the upper, central, and lower portions is preferably 30% or more, and more preferably 32% or more. There is no particular upper limit for the above {100} area ratio of each of the upper, central, and lower portions, but it may typically be 60% or less.

(Method for Measuring {111} Area Ratio and {100} Area Ratio Using EBSD Method)

The methods for determining the {111} area ratio and the {100} area ratio using the EBSD method will be described below with reference to FIG. 1. First, from the plate-shaped niobium sputtering target 100, a cross section 40 perpendicular to a sputtering surface 50 and through a center A of the sputtering surface 50 is cut out, polished with polishing paper (which corresponds to #2000 (JIS R 6253: 2006)), buffed with POLIPLA solution to finish it to a mirror surface, and then treated with a mixed solution of hydrofluoric acid, nitric acid, and hydrochloric acid.

Subsequently, using an EBSD system (e.g., JSM-7001 FTTLS type field emission electron microscope/crystal orientation analyzer OIM 6.0-CCD/BS), the crystal orientation distribution at a position of an intermediate B (width W: 1 mm) between a center A and an outer circumference C of the sputtering surface 50 in the polished cross section 40. The position of the outer circumference C is defined as "15 mm from the outermost circumference in the central direction". For example, for the niobium sputtering target having a radius of 165 mm, the center A is located at a position of 165 mm from the outermost circumference in the central direction, the outer circumference C is located at a position of 15 mm from the outermost circumference in the central direction, and the intermediate B is located at a position of 90 mm from the outermost circumference in the central direction. The measured region is in the total width of 1 mm: 0.5 mm in the outer circumference direction and 0.5 mm in the central direction, using the intermediate B as a center. When measuring the center A or the outer circumference C, the measured region may be in the total width of 1 mm: 0.5 mm in the circumferential directions facing each other with the center A as a center, and in the total width of 1 mm: 0.5 mm in the outer circumference direction and 0.5 mm in the central direction with the outer circumference C as a center. Examples of measurement conditions of the EBSD system can be an acceleration voltage of 15 kv, an irradiation current of 3.6 nA, magnifications of 20×, and a tilt of 70°. The crystal orientation distribution is obtained by dividing a thickness T of the niobium sputtering target 100 into three equal portions: an upper portion 10, a central portion 20, and a lower portion 30 from the sputtering surface 50 side in the normal direction of the sputtering surface 50, and then determining the {111} area ratio and the {100} area ratio for each measured region of the upper portion 10, the central portion 20, and the lower portion 30 according to the Equations (1) and (3) as described above.

In the specification, the crystal grains having the {111} plane oriented in the normal direction of the sputtering plane include those in which orientation deviation of the {111} plane relative to the normal direction of the sputtering plane is 15° or less. Also, the crystal grains having the {100} plane oriented in the normal direction of the sputtering plane include those in which orientation deviation of the {100} plane relative to the normal direction of the sputtering plane is 15° or less.

The disk-shaped niobium sputtering target 100 is illustrated herein. If the shape of the niobium sputtering target is a flat plate such as a rectangular flat plate, the cross section of the target perpendicular to the sputtering surface at the intermediate position between the center and the outer circumference of the sputtering surface may be measured by EBSD measurement, as with the disk-shaped sputtering target.

(Average Crystal Grain Size)

In an embodiment of the niobium sputtering target according to the present invention, an average crystal grain size of each of the upper, central, and lower portions of the sputtering target at the intermediate position between the center and outer circumference of the sputtering surface is preferably from 30 to 100 μm. Since the crystal grain sizes of the crystal grains in the sputtering target affect mechanical properties such as strength of the target, uniformity of the structure, and the deposition rate, as well as a degree of abnormal discharge and generation of particles, it is effective to control the crystal grain size appropriately. According to this embodiment, the crystal grain size is in the above range throughout the thickness direction of the target, so that a variation in the crystal grain size that successively appears on the surface due erosion during sputtering is lower even as sputtering progresses, and stable sputtering characteristics can be achieved throughout the target life.

Each average crystal grain size of the upper, central, and lower portions is preferably 100 μm or less, and more preferably 80 μm or less, and even more preferably 70 μm or less. Each average crystal grain size of the upper, central, and lower portions is preferably 30 μm or more, and more preferably 40 μm or more, and even more preferably 50 μm or more.

(Evaluation Method of Average Crystal Grain Size)

The average crystal grain sizes of the upper, central, and lower portions can be measured by the EBSD method as in the measurement of the {111} area ratio and {100} area ratio. More Specifically, the number of crystal grains contained in the measured region of each of the upper, central, and lower portions is calculated by the EBSD method, an average area per a grain present in each measured region is determined, and its equivalent circular diameter is determined to be the average crystal grain size.

(Rate of Change in Average Crystal Grain Size)

In an embodiment of the niobium sputtering target according to the present invention, it is preferable that a rate of change represented by the following Equation (4) is 1.0 or less for the average crystal grain sizes of the upper, central, and lower portions:

the rate of change=[maximum value−minimum value]/minimum value     Formula (4).

The average crystal grain size of each of the upper, center, and lower portion within the above range of the rate of change means that the average crystal grain sizes of the upper, center, and lower portions are not significantly changed. Therefore, it contributes to improving the film thickness uniformity through the target life.

The rate of change represented by the Equation (4) as described above is preferably 1.0 or less, and more preferably 0.5 or less, and even more preferably 0.2 or less. There is no particular lower limit for the rate of change represented by the Equation (4) above, and most preferably zero, but it may typically 0.01 or more.

(2) Method for Producing Niobium Sputtering Target (First Production Method)

First, we explain a method for producing a niobium sputtering target having a decreased rate of change in a {111} area controlled by preventing the {111} plane of the crystal grains from being oriented in the normal direction of the sputtering surface. Niobium is firstly melted and cast to produce an ingot, which is then forged. The ingot is then subjected to press forging to produce a billet, which is then cut to an appropriate size and subjected to a heat treatment. The forging and heat treatment are then repeated twice. A temperature of the heat treatment is not particularly limited, but from the viewpoint of adjusting a forging structure, the temperature is preferably 700° C. or higher, and more preferably 720° C. or higher, and even more preferably 750° C. or higher. However, from the viewpoint of preventing excessive growth of crystal grains, the temperature of the above heat treatment is preferably 900° C. or lower, and more preferably 850° C. or lower, and even more preferably 800° C. or lower. The number of the forging processes can be selected as needed to adjust the forging structure.

After all the forging steps are completed, the billet can be further cut into two pieces to expose crystal textures formed inside the forged body to the cut surface, thereby preventing an impact of the crystal textures from being carried over the next rolling step. The cutting of the billet into two pieces is useful for preventing the {111} plane of the crystal grains from being oriented in the normal direction of the sputtering surface, especially at the central portion in the thickness direction.

Next, in the rolling step, rolling is repeated at a predetermined rolling reduction ratio on the forged body to obtain a rolled plate having a certain thickness. At this time, from the viewpoint of preventing the {111} plane of the crystal grains from being oriented in the normal direction of the spattering surface due to strong rolling, the rolling reduction ratio per a pass is preferably 18% or less, and more preferably 15% or less, and even more preferably 12% or less. The rolling reduction ratio per a pass is typically 2% or more, and more typically 4% or more, in terms of a production efficiency. In this case, the number of rolling passes is, for example, 11 or more. The above number of rolling passes is preferably 11 or more, and more preferably 15 or more, and even more preferably 18 or more, in terms of relatively increasing a percentage of crystal grains having the {100} plane oriented in the normal direction. The above number of rolling passes is preferably 40 or less, and more preferably 30 or less, and even more preferably 25 or less, in terms of the production efficiency.

In the rolling step, it is preferable to rotate the rolling direction of the forged body by 75 to 105° in parallel to the rolling plane for each pass, and more preferable by 85 to 95°, in terms of preventing the {111} plane of the crystal grains from being oriented in the normal direction of the spattering surface. By rotating the rolling direction at the given angle for each pass, the generation of band can be suppressed.

Furthermore, after the above number of rolling passes, the rolled plate may be rolled several times while changing the rolling direction as needed in order to adjust the shape of the rolled plate. In this case, the total rolling ratio is preferably adjusted to 75% or more, and more preferable 80% or more, in terms of providing uniform and fine crystal grains.

Moreover, although the heat treatment may be carried out during the rolling, it is recommended that the heat treatment is carried out (preferably for 4 hours or more) after final rolling without performing the heat treatment during the rolling. Here, a temperature of the heat treatment is not particularly limited. In terms of providing a recrystallized structure, the temperature is preferably 700° C. or higher, and more preferably 750° C. or higher, and even more preferably 800° C. or higher. However, the temperature of the heat treatment is preferably 900° C. or lower, and more preferably 870° C. or lower, and even more preferably 850° C. or lower, in terms of preventing excessive growth of crystal grains.

This is then machined into a desired shape to produce a target. The crystal textures formed by the rolling and heat treatment can be recognized as to what face is preferentially oriented by the EBSD method, and its results can be fed back to the rolling and heat treatment conditions, thereby obtaining a desirable orientation of the structure.

(Second Production Method)

Next, we will explain a method for producing a niobium sputtering target having a deceased rate of change of the {111} area controlled by expanding a region where the {111} plane of the crystal grains is oriented in the normal direction of the sputtering surface to the entire thickness direction of the target. First, the method is carried out in the same manner as that of the first production method until the end of the forging step. However, after the end of all of the forging steps, it is preferable not to divide the billet. This is because no dividing of the billet facilitates the orientation of the {111} plane of the crystal grains in the normal direction of the sputtering surface. Subsequently, in the rolling step, the rolling may be repeated within the ranges of the number of passes and the rolling reduction ratio as described in the first production method, with the exception that the rolling direction of the forged body is kept constant. The rolling step can expand the region where the {111} plane of the crystal grains is oriented in the normal direction of the sputtering surface to the entire thickness direction of the target. Steps after the rolling are the same as those of the first production method. However, in the second production method, the rolling reduction ratio per a pass and the total rolling reduction ratio in the rolling step are increased as compared with those of the first production method, so that the region where the {111} plane of the crystal grains is oriented in the normal direction of the sputtering surface can be further expanded to the entire thickness direction of the target.

EXAMPLES

The present invention will be described in detail based on Examples and Comparative Examples. The Examples are intended to illustrate the present invention, and the present invention is not limited to these Examples. That is, the present invention includes other embodiments and variations included in the scope of the present invention.

Example 1

A niobium raw material with a purity of 99.95% by mass was melted by electron beam and cast to prepare an ingot having a length of 600 mm and a diameter of 245 mm φ. The ingot was then subjected to cold press forging to have a diameter of 150 mm φ, and then cut to a required length to obtain a billet. The billet was then subjected to a heat treatment at 1000° C., primary cold forging again, a primary heat treatment at 800° C., and then secondary cold forging to have a cylindrical shape, and the forged billet was divided into two parts, which were subjected to the secondary heat treatment at 800° C. again.

The forged billet was subjected to cold rolling. A total of 20 rolling steps was repeated while rotating the rolling direction by 90° in a parallel direction to the rolling surface per a pass (rolling reduction ratio: 11%). The total rolling reduction ratio was 89%. After the rolling, the material was subjected to a heat treatment at 800° C. The resulting target material having a thickness of 8 mm and a diameter of 400 mm φ was subjected to finish machining to produce a niobium sputtering target having a thickness of 6.35 mm and a diameter of 322 mm EBSD Measurement (Crystal Orientation Distribution)

Figure 2:
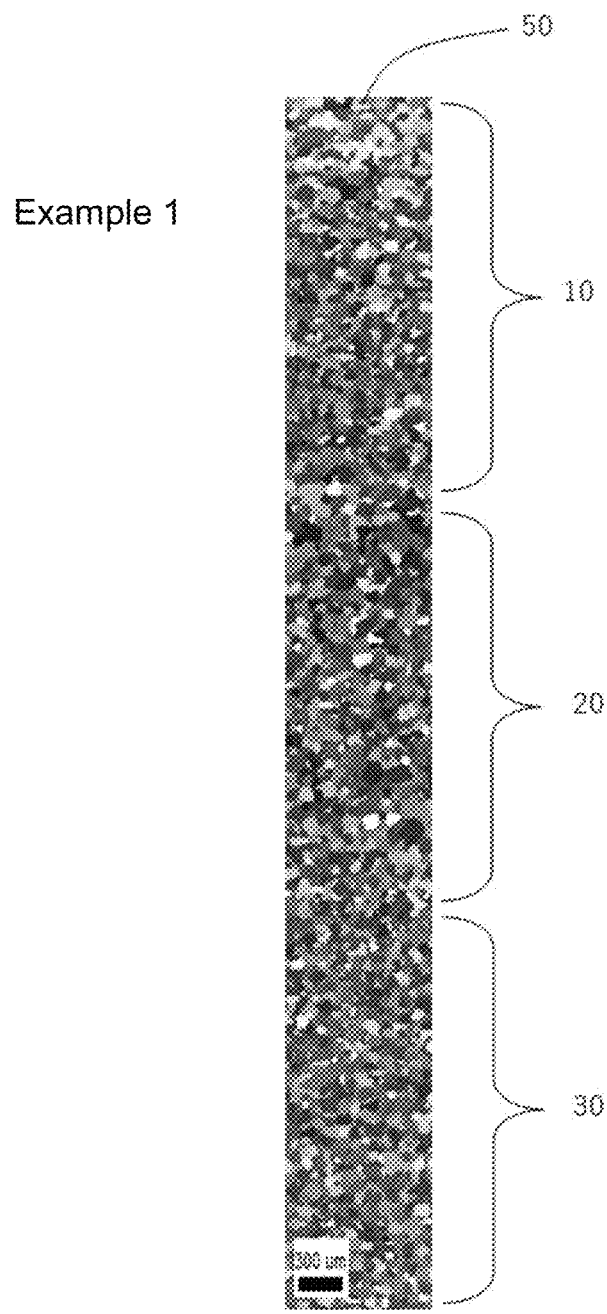
FIG. 2 shows a crystal orientation distribution when EBSD measurement is performed on a cross section of a target perpendicular to a sputtering surface at an intermediate position between a center and an outer circumference of the sputtering surface of a niobium sputtering target obtained in Example 1.

The resulting niobium sputtering target was subjected to EBSD measurement using an EBSD system (e.g., JSM-7001 FTTLS type field emission electron microscope/crystal orientation analyzer OIM6.0-CCD/BS) according to the procedure as described above to obtain crystal orientation distributions of the upper portion, the central portion, and the lower portion at the intermediate position between the center and the outer circumference of the sputtering surface (FIG. 2). The measurement conditions of the EBSD system were: an acceleration voltage of 15 kv, an irradiation current of 3.6 nA, magnifications of 20×, and a tilt of 70°.

Based on the obtained crystal orientation distributions, the {111} area ratio was determined for each of the measured regions of the upper, central, and lower portions, and the rate of change was calculated by the Equation: rate of change=[maximum value−minimum value]/minimum value. Similarly, the {100} area ratio was determined for each of the measured regions of the upper, central, and lower portions at the intermediate position between the center and the outer circumference of the sputtering surface, and the rate of change was calculated by the Equation: rate of change=[maximum value−minimum value]/minimum value. The results are shown in Table 1.

The center and outer circumference of the sputtering surface of the resulting niobium sputtering target were also subjected to the EBSD measurement to obtain crystal orientation distributions of the upper, central, and lower portions. Based on the obtained crystal orientation distributions, the {111} area ratio was determined for each of the above measured regions of the upper, central, and lower portions, and the rate of change was calculated by the Equation: rate of change=[maximum value−minimum value]/minimum value.

(Average Crystal Grain Size)

The above EBSD measurement was used to determine the average crystal grain size in each of the above measured regions of the upper, central, and lower portions at the intermediate position between the center and the outer circumference of the sputtering surface, and the rate of change was calculated by the Equation: rate of change=[maximum value−minimum value]/minimum value. The results are shown in Table 1.

Example 2

Figure 3:
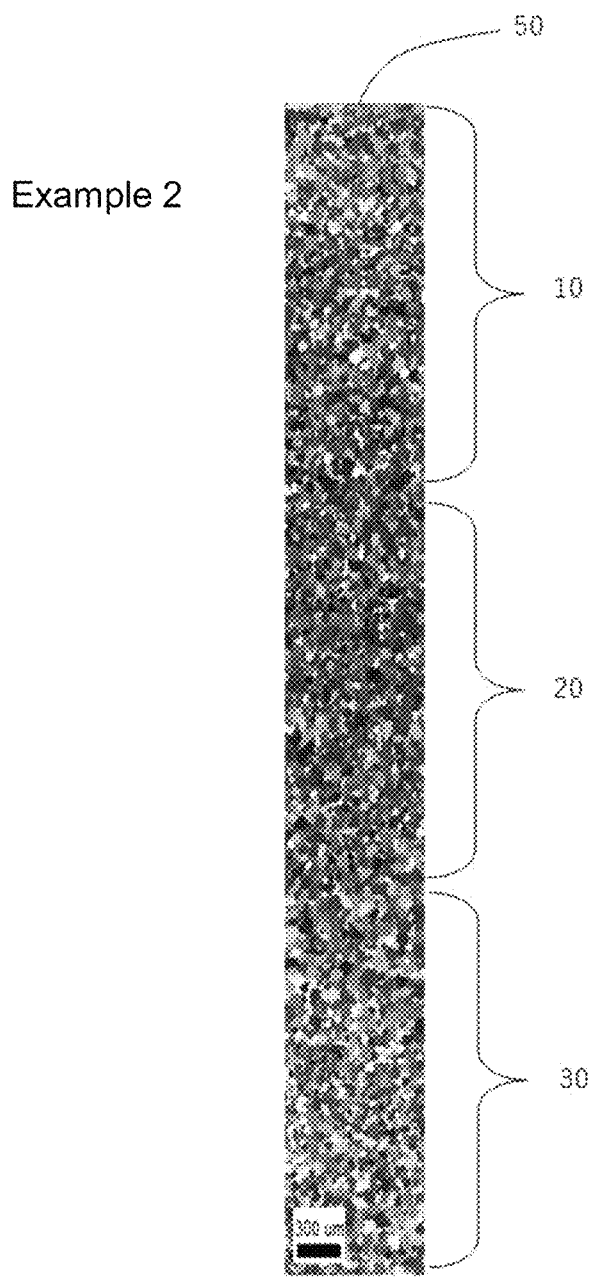
FIG. 3 shows a crystal orientation distribution when EBSD measurement is performed on a cross section of a target perpendicular to a sputtering surface at an intermediate position between a center and an outer circumference of the sputtering surface of a niobium sputtering target obtained in Example 2.

The same method as that of Example 1 was carried out until the primary heat treatment to forge the material into an angular shape, and the final heat treatment at 800° C. was carried out without dividing the forged product to produce an angular forged billet. The forged billet was then subjected to cold rolling. The rolling step was repeated by 19 passes in one direction (a rolling reduction ratio per a pass: 11%) without changing the rolling direction. The total rolling reduction ratio was 89%. After rolling, the product was subjected to a heat treatment at 800° C. The resulting angular target material having a thickness of 9 mm, a width of 220 mm and a length of 480 mm was then subjected to finish machining to produce a niobium sputtering target having a thickness of 7 mm and a diameter of 180 mm The resulting niobium sputtering target was subjected to EBSD measurement using the same method as that of Example 1 to obtain crystal orientation distributions of the upper portion, the central portion, and the lower portion at the intermediate position between the center and the outer circumference of the sputtering surface (FIG. 3). The same evaluation as that of Example 1 was then carried out. The center and outer circumference of the sputtering surface were also subjected to the EBSD measurement as in Example 1 to obtain crystal orientation distributions of the upper, central, and lower portions. The results are shown in Table 1.

Comparative Example 1

Figure 4:
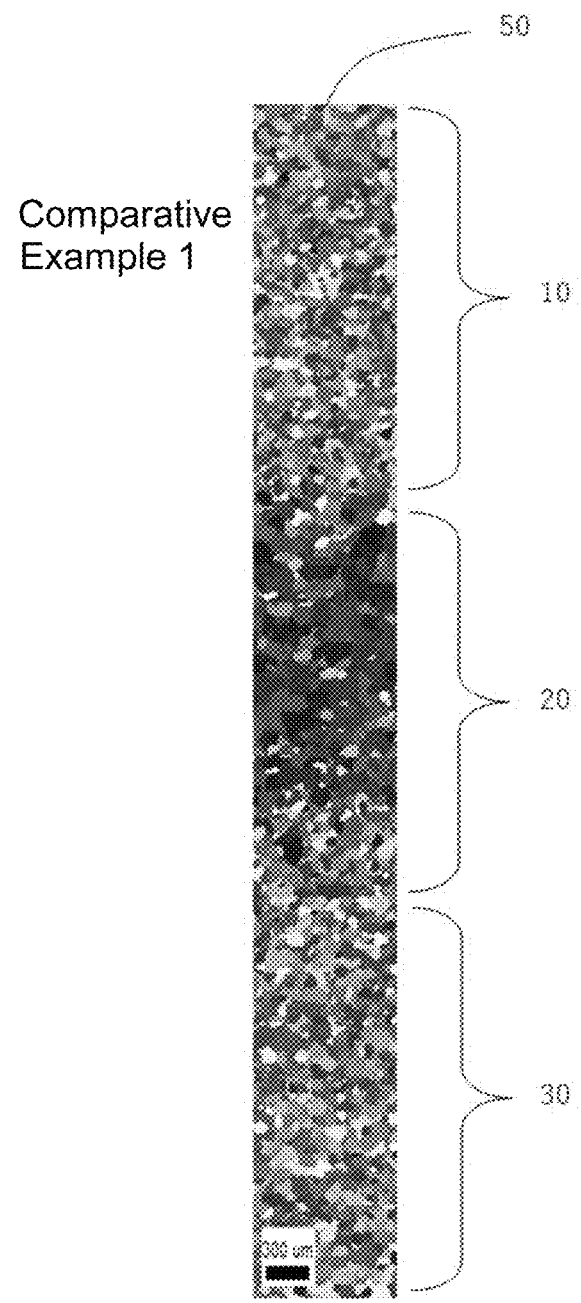
FIG. 4 shows a crystal orientation distribution when EBSD measurement is performed on a cross section of a target perpendicular to a sputtering surface at an intermediate position between a center and an outer circumference of the sputtering surface of a niobium sputtering target obtained in Comparative Example 1.

The same method as that of Example 1 was carried out until the primary heat treatment to forge the material into an angular shape, and the final heat treatment at 800° C. was carried out without dividing the forged product to produce a billet. The forged billet was then subjected to cold rolling. A total of 22 rolling steps was repeated while rotating the rolling direction by 90° in a parallel direction to the rolling surface per a pass (rolling reduction ratio: 11%). The total rolling reduction ratio was 89%. After rolling, the product was subjected to a heat treatment at 800° C. The resulting angular target material having a thickness of 9 mm and a square of 400 mm was then subjected to finish machining to produce a niobium sputtering target having a thickness of 7 mm and a diameter of 180 mm The resulting niobium sputtering target was subjected to EBSD measurement using the same method as that of Example 1 to obtain crystal orientation distributions of the upper portion, the central portion, and the lower portion at the intermediate position between the center and the outer circumference of the sputtering surface (FIG. 4). The same evaluation as that of Example 1 was then carried out. The center and outer circumference of the sputtering surface were also subjected to the EBSD measurement as in Example 1 to obtain crystal orientation distributions of the upper, central, and lower portions. The results are shown in Table 1.

Comparative Example 2

The same method as that of Example 1 was carried out until the primary heat treatment to forge the material into a cylindrical shape, and the final heat treatment at 800° C. was carried out without dividing the forged product to produce a billet. The forged billet was then subjected to cold rolling. A total of 20 rolling steps was repeated while rotating the rolling direction by 90° per a pass (rolling reduction ratio: 11%). The total rolling reduction ratio was 86%. After rolling, the product was subjected to a heat treatment at 800° C. The resulting target material having a thickness of 8 mm and a diameter of 370 mm φ was then subjected to finish machining to produce a niobium sputtering target having a thickness of 6.35 mm and a diameter of 322 mm φ.

The resulting niobium sputtering target was subjected to EBSD measurement using the same method as that of Example 1 to obtain crystal orientation distributions of the upper portion, the central portion, and the lower portion at the intermediate position between the center and the outer circumference of the sputtering surface. The same evaluation as that of Example 1 was then carried out. The center and outer circumference of the sputtering surface were also subjected to the EBSD measurement as in Example 1 to obtain crystal orientation distributions of the upper, central, and lower portions. The results are shown in Table 1.

TABLE 1

| | | {111} Area Ratio (%) | | | {100} Area Ratio (%) | Average Crystal Grain |
| --- | --- | --- | --- | --- | --- | --- |
| | | Center | Intermediate | Outer Circumference | at Intermediate Position | Size (μm) at Intermediate Position |
| Example 1 | Upper Portion | 10.3 | 16.4 | 13.5 | 44.6 | 56.7 |
| | Central Portion | 19.1 | 32.3 | 21.5 | 32 | 61.5 |
| | Lower Portion | 5.8 | 10.5 | 14.1 | 53.6 | 57 |
| | Rate of Change | 2.29 | 2.08 | 0.59 | 0.68 | 0.08 |
| | Maximum-Minimum | 13.3 | 21.8 | 8 | 21.6 | 4.8 |
| Example 2 | Upper Portion | 30.4 | 42.1 | 58 | 14.9 | 47.4 |
| | Central Portion | 57.1 | 66.1 | 64.9 | 4.6 | 47.9 |
| | Lower Portion | 21.7 | 26.2 | 46.7 | 17.8 | 48 |
| | Rate of Change | 1.63 | 1.52 | 0.39 | 2.87 | 0.01 |
| | Maximum-Minimum | 35.4 | 39.9 | 18.2 | 13.2 | 0.6 |
| Comparative Example 1 | Upper Portion | 12.9 | 10.6 | 11.2 | 53.9 | — |
| | Central Portion | 56 | 73.3 | 66.3 | 0.9 | — |
| | Lower Portion | 11.9 | 9.3 | 6.9 | 53.9 | — |
| | Rate of Change | 3.71 | 6.88 | 8.61 | 58.9 | — |
| | Maximum-Minimum | 44.1 | 64 | 59.4 | 53 | — |
| Comparative Example 2 | Upper Portion | 15.9 | 12.7 | 25 | 56 | — |
| | Central Portion | 25.4 | 49.1 | 35.2 | 22.6 | — |
| | Lower Portion | 9.5 | 10.1 | 21.8 | 60.7 | — |
| | Rate of Change | 1.67 | 3.86 | 0.61 | 1.69 | — |
| | Maximum-Minimum | 15.9 | 39 | 13.4 | 38.1 | — |

INDUSTRIAL APPLICABILITY

The niobium sputtering target according to this embodiment can form a thin film having improved film thickness uniformity throughout the target life by setting orientation of the structure to a predetermined state. Therefore, the present invention is useful as a niobium sputtering target for use in forming thin films of anti-reflection films for display devices.

DESCRIPTION OF REFERENCE NUMERALS 10 upper portion
20 central portion
30 lower portion
40 cross section
50 spattering surface
100 niobium sputtering target
A center
B intermediate
C outer circumference
T thickness
W width

The invention claimed is:

1. A niobium sputtering target, wherein a rate of change in a {111} area ratio of each of an upper, central, and lower portions of the sputtering target, as represented by the following equation (2), is 0.59 or more and 2.5 or less, wherein the {111} area ratio of each of the upper, central and lower portions is determined by dividing a cross section of a plate-shaped sputtering target perpendicular to a sputtering surface into three equal portions: the upper portion, the central portion and the lower portion from a sputtering surface side in a normal direction of the sputtering surface at an intermediate position between a center and an outer circumference of the sputtering surface of the plate-shaped sputtering target, and measuring a crystal orientation distribution of each of measured regions of the upper portion, the central portion, and the lower portion using an EBSD method:

the {111} area ratio=total area of crystal grains having the {111} plane oriented in the normal direction in the measured regions/total area of the measured regions   Equation (1)

the rate of change=[a maximum value of the {111} area ratio−a minimum value of the {111} area ratio]/the minimum value of the {111} area ratio   Equation (2).

2. The niobium sputtering target according to claim 1, wherein the {111} area ratio of the central portion is 40% or less.

3. The niobium sputtering target according to claim 1, wherein the {111} area ratio of the central portion is 60% or more.

4. The niobium sputtering target according to claim 1, wherein a {100} area ratio of each of the upper portion, the central portion, and the lower portion is 30% or more, wherein the {100} area ratio is determined by measuring a crystal orientation distribution of each of the upper portion, the central portion and the lower portion using a EBSD method, and obtaining the {100} area ratio of each of measured regions of the upper portion, the central portion, and the lower portion according to the following Equation (3):

the {100} area ratio=total area of crystal grains having a {100} plane oriented in the normal direction in the measured regions/total area of the measured regions   Equation (3).

5. The niobium sputtering target according to claim 1, wherein each of the upper portion, the central portion, and the lower portion has an average crystal grain size of from 30 to 100 μm.

6. The niobium sputtering target according to claim 1, wherein a rate of change represented by the following Equation (4) is 1.0 or less for the average crystal grain size of each of the upper portion, the central portion, and the lower portion:

the rate of change=[a maximum value of the average crystal grain size−a minimum value of the average crystal grain size]/the minimum value of the average crystal grain size   Equation (4).

7. A niobium sputtering target, wherein a rate of change in a {111} area ratio of each of an upper, central, and lower portions of the sputtering target, as represented by the following equation (2), is 2.5 or less, wherein each of the upper portion, the central portion, and the lower portion has an average crystal grain size of 40 μm or more and 100 μm or less, and wherein the {111} area ratio of each of the upper, central and lower portions is determined by dividing a cross section of a plate-shaped sputtering target perpendicular to a sputtering surface into three equal portions: the upper portion, the central portion and the lower portion from a sputtering surface side in a normal direction of the sputtering surface at an intermediate position between a center and an outer circumference of the sputtering surface of the plate-shaped sputtering target, and measuring a crystal orientation distribution of each of measured regions of the upper portion, the central portion, and the lower portion using an EBSD method:

the {111} area ratio=total area of crystal grains having the {111} plane oriented in the normal direction in the measured regions/total area of the measured regions   Equation (1)

the rate of change=[a maximum value of the {111} area ratio−a minimum value of the {111} area ratio]/the minimum value of the {111} area ratio   Equation (2).

* * * * *